US012772457B2

(12) United States Patent
Lin et al.

(10) Patent No.: US 12,772,457 B2
(45) Date of Patent: Oct. 20, 2026

(54) SEMICONDUCTOR DEVICE WITH FERROELECTRIC LAYER AND METHOD OF FORMING THE SAME

(71) Applicant: Taiwan Semiconductor Manufacturing Company, Ltd., Hsinchu (TW)

(72) Inventors: Bo-Jiun Lin, Hsinchu County (TW); Chih-Sheng Chang, Hsinchu (TW); Yu-Chao Lin, Hsinchu City (TW); Tung-Ying Lee, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 466 days.

(21) Appl. No.: 18/356,244

(22) Filed: Jul. 21, 2023

(65) Prior Publication Data

US 2025/0031381 A1 Jan. 23, 2025

(51) Int. Cl.

| | |
|---|---|
| ***H10B 53/30*** | (2023.01) |
| ***H10B 51/30*** | (2023.01) |
| ***H10D 1/68*** | (2025.01) |
| ***H10D 64/68*** | (2025.01) |

(52) U.S. Cl.

CPC ............. *H10B 53/30* (2023.02); *H10B 51/30* (2023.02); *H10D 1/682* (2025.01); *H10D 1/684* (2025.01); *H10D 1/688* (2025.01); *H10D 1/694* (2025.01); *H10D 1/696* (2025.01); *H10D 64/681* (2025.01); *H10D 64/683* (2025.01); *H10D 64/689* (2025.01)

(58) Field of Classification Search

CPC ........ H10B 51/30; H10B 53/30; H10D 1/682; H10D 1/684; H10D 1/688; H10D 1/694; H10D 1/696; H10D 64/033; H10D 64/681; H10D 64/683; H10D 64/689

See application file for complete search history.

(56) References Cited

U.S. PATENT DOCUMENTS

| | | | | |
|---|---|---|---|---|
| 2021/0398990 | A1 * | 12/2021 | Chia | H10D 64/017 |
| 2024/0196623 | A1 * | 6/2024 | Lee | H10D 64/689 |
| 2024/0347397 | A1 * | 10/2024 | Manipatruni | H01L 22/20 |

FOREIGN PATENT DOCUMENTS

| | | | | |
|---|---|---|---|---|
| KR | 20240143092 A | * 10/2024 | | C04B 35/48 |
| KR | 20240146494 A | * 10/2024 | | H01L 21/02274 |
| WO | WO-2023004379 A1 | * 1/2023 | | H10N 70/041 |

* cited by examiner

*Primary Examiner* — Matthew E Warren
(74) *Attorney, Agent, or Firm* — JCIPRNET

(57) ABSTRACT

A method of forming a semiconductor device is provided. A first ferroelectric inducing layer including Ru is deposited on a substrate. A ferroelectric layer including HfZrO is deposited on the first ferroelectric inducing layer. A second ferroelectric inducing layer including Ru is deposited on the ferroelectric layer, wherein the HfZrO of the ferroelectric layer is in physical contact with the Ru of the first ferroelectric inducing layer and the Ru of the second ferroelectric inducing layer. The second ferroelectric inducing layer, the ferroelectric layer and the first ferroelectric inducing layer are patterned.

20 Claims, 11 Drawing Sheets

SEMICONDUCTOR DEVICE WITH FERROELECTRIC LAYER AND METHOD OF FORMING THE SAME

BACKGROUND

Many modern day electronic devices contain electronic memory. Electronic memory may be volatile memory or non-volatile memory. Non-volatile memory is able to store data in the absence of power, whereas volatile memory is not. Ferroelectric (FE) memory is a candidate for next generation non-volatile memory benefits due to its fast write/read speed and small size.

A ferroelectric material refers to a material that can maintain electrical polarization in the absence of external electrical field. The electrical polarization in a ferroelectric material has a hysteresis effect, enabling encoding of a data bit as a polarization direction within the ferroelectric material. In a ferroelectric tunnel junction device, a change in the direction of polarization causes a change in tunneling resistance, which can be employed to measure the direction of the electrical polarization and extract the value of the data bit stored in the ferroelectric tunnel junction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
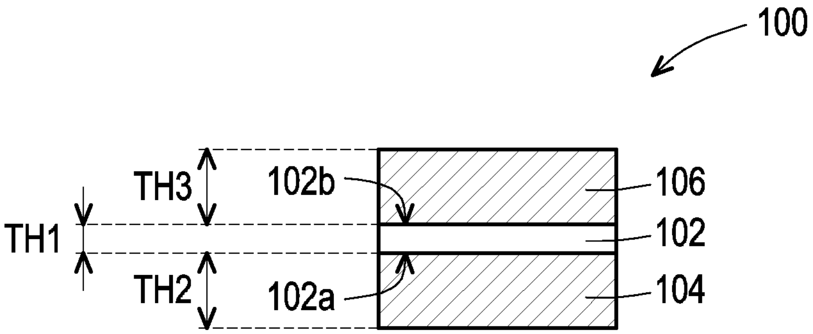
FIG. 1 illustrates a cross-sectional view of a ferroelectric structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device of the disclosure includes a ferroelectric memory device, such as a ferroelectric field-effect transistor (FeFET) device, a ferroelectric random-access memory (FeRAM) device or a ferroelectric tunnel junction (FTJ) device. Such ferroelectric memory device includes a ferroelectric structure, and the ferroelectric memory device can be read and/or written by applying an electric field to the ferroelectric layer (i.e., by applying a voltage across the ferroelectric layer). When the electric field is applied to the ferroelectric layer, the ferroelectric layer is polarized in a first direction (e.g., corresponding to a logic "0") or a second direction (e.g., corresponding to a logic "1"), opposite the first direction, depending on the direction of the applied electric field (i.e., depending on the sign of the voltage applied across the ferroelectric layer).

In some devices, the ferroelectric properties (e.g., a polarization or the like) of the ferroelectric layer are dependent on both the material(s) of the ferroelectric layer and the material(s) of neighboring layers (e.g., the lower metal layer and the upper metal layer) that contact the ferroelectric layer at interfaces with the ferroelectric layer. Further, in some devices where the ferroelectric layer has a small thickness (e.g., a thickness of about 10 nanometers or less), the ferroelectric properties of the ferroelectric layer may largely depend on the material properties of the neighboring layers at the interfaces rather than the material properties of the ferroelectric layer itself.

The present disclosure is directed to ferroelectric structure that include a thin HfZrO-containing ferroelectric layer sandwiched by two Ru-based layers. The Ru-based layers play a significant role in inducing the ferroelectric crystalline phase and therefore improve the ferroelectric properties (such as remanent polarization (Pr) and leakage current) in the thin ferroelectric layer. The Ru-based layers in contact with the HfZrO ferroelectric layer provide good interfaces to induce the ferroelectric layer to form with the desired phase such as orthorhombic crystalline phase. Specifically, the thin ferroelectric layer deposited by the method of the disclosure exhibits sufficient ferroelectric properties without the conventional post-annealing process. Therefore, the manufacturing process is simplified and the production cost is reduced.

FIG. 1 illustrates a cross-sectional view of a ferroelectric structure according to some embodiments of the present disclosure.

Referring to FIG. 1, the ferroelectric structure 100 includes a ferroelectric layer 102 has a first surface **102*a* and a second surface 102*b* opposite the first surface 102*a*. In some embodiments, the ferroelectric layer 102** includes $Hf_xZr_yO_z$ (or called "HfZrO" or "HZO" in some examples), wherein x, y and z are greater than 0. For example, x ranges from 0.4 to 0.6 such as 0.5, y ranges from 0.4 to 0.6 such as 0.5, and z is 2. The method of forming the ferroelectric layer 102 include performing a suitable deposition process such as atomic layer deposition (ALD), which will be described in details below.

The ferroelectric structure 100 further includes a first ferroelectric inducing layer 104 on the first side 102*a* of the ferroelectric layer 102. The first ferroelectric inducing layer 104 is configured to induce the ferroelectric properties in the ferroelectric layer 102. The first ferroelectric inducing layer 104 abuts the first surface 102*a* of the ferroelectric layer 102. In some embodiments, the first ferroelectric inducing layer 104 is in direct contact with the first surface 102*a* of the ferroelectric layer 102, and the forming method includes performing a suitable deposition process such as chemical vapor deposition (CVD), physical vapor deposition (PVD) or the like. In some embodiments, the first ferroelectric inducing layer 104 includes Ru, RuCo, RuW or a combination thereof, and the forming method includes performing a suitable deposition process such as chemical vapor deposition (CVD), physical vapor deposition (PVD) or the like.

In some embodiments, the Ru atom content of the first ferroelectric inducing layer 104 ranges from about 10 at % to about 100 at %, such as from about 30 at % to about 100 at % or from about 50 at % to about 100 at %. In some embodiments, the Ru atom content of the first ferroelectric inducing layer 104 is substantially constant along the thickness direction of the first ferroelectric layer 104, such as about 100 at %. In some embodiments, the Ru atom content of the first ferroelectric inducing layer 104 is gradually increased, from about 50 at % to about 100 at %, towards the first side 102*a* of the ferroelectric layer 102. In some embodiments, the first ferroelectric inducing layer 104 may include a Ru-alloy layer (e.g., RuCo, RuW) and a Ru layer, and the Ru layer is in contact with the first side 102*a* of the ferroelectric layer 102. Other transition metal such as Mo, Rh or Ir may be applied to the first ferroelectric inducing layer 104 instead of Ru.

The ferroelectric structure 100 further includes a second ferroelectric inducing layer 106 on the second side 102*b* of the ferroelectric layer 102. The second ferroelectric inducing layer 106 is configured to induce the ferroelectric properties in the ferroelectric layer 102. The second ferroelectric inducing layer 106 abuts the second surface 102*b* of the ferroelectric layer 102. In some embodiments, the second ferroelectric inducing layer 106 is in direct contact with the second surface 102*b* of the ferroelectric layer 102. In some embodiments, the Ru atom content of the second ferroelectric inducing layer 106 ranges from about 10 at % to about 100 at %, such as from about 30 at % to about 100 at % or from about 50 at % to about 100 at %. In some embodiments, the Ru atom content of second ferroelectric inducing layer 106 is substantially constant along the thickness direction of the second ferroelectric inducing layer 106, such as about 100 at %. In some embodiments, the Ru atom content of the second ferroelectric inducing layer 106 is gradually increased, from about 50 at % to about 100 at %, towards the second side 102*b* of the ferroelectric layer 102. In some embodiments, the second ferroelectric inducing layer 106 may include a Ru-alloy layer (e.g., RuCo, RuW) and a Ru layer, and the Ru layer is in contact with the second side 102*b* of the ferroelectric layer 102. Other transition metal such as Mo, Rh or Ir may be applied to the first ferroelectric inducing layer 104 instead of Ru.

In some embodiments, the ferroelectric layer 102 has a substantially small thickness TH1, such as about 10 nanometers or less, about 5 nanometers or less, between about 1 nanometer and about 8 nanometers, or between about 5 nanometers and about 7 nanometers, so as to reduce the size of the memory cell.

In some embodiments, each of the thickness TH2 of the first ferroelectric inducing layer 104 and the thickness TH3 of the second ferroelectric inducing layer 106 is about 2 to 5 times the thickness of the ferroelectric layer 102. In some embodiments, each of the the first ferroelectric inducing layer 104 and the second ferroelectric inducing layer 106 has a thickness of about 2 nanometers to 50 nanometers, such as 15 nanometers to 30 nanometers. In some embodiments, the thickness TH2 of the first ferroelectric inducing layer 104 is substantially the same as the thickness TH3 of the second ferroelectric inducing layer 106, but the disclosure is not limited thereto. In other embodiments, the thickness TH2 of the first ferroelectric inducing layer 104 is different from (e.g., greater than or smaller than) the thickness TH3 of the second ferroelectric inducing layer 106.

The ferroelectric structure 100 of the disclosure includes, from bottom to top, a metal layer as a ferroelectric inducing layer, a ferroelectric layer, and another metal layer as another ferroelectric inducing layer. Such ferroelectric structure 100 is referred to as a "metal-ferroelectric-metal (MFM) scheme" in some examples.

Figure 2:
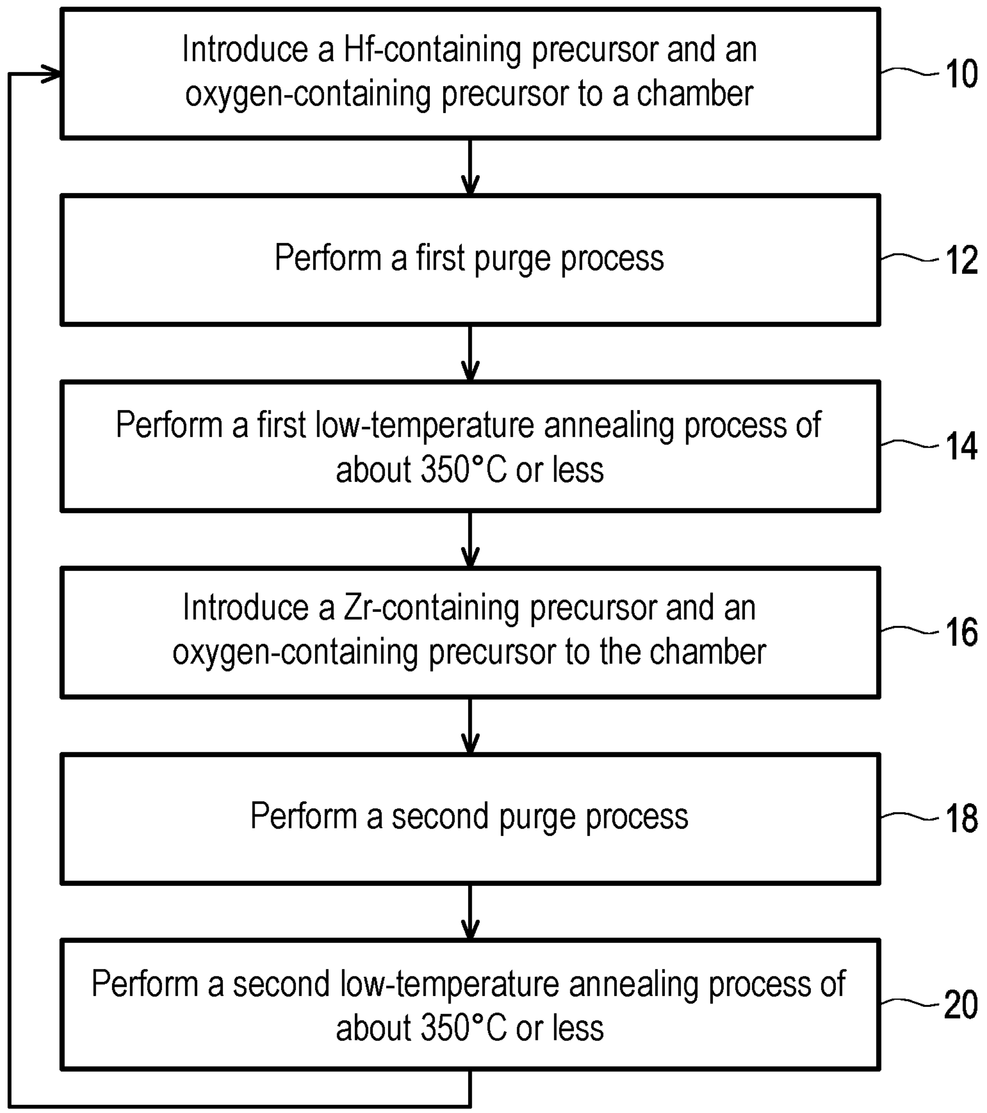
FIG. 2 illustrates a method of forming a ferroelectric layer according to some embodiments of the present disclosure.

FIG. 2 illustrates a method of forming a ferroelectric layer according to some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 10, a Hf-containing precursor and an oxygen-containing precursor are introduced to a chamber to deposit a $HfO_x$ layer (wherein x is greater than 0) on a substrate. In some embodiments, the substrate is a Ru-based substrate, such as the first ferroelectric inducing layer 104 of FIG. 1. In some embodiments, the Hf-containing precursor includes tetrakis(dimethylamino)hafnium (TDMAH) or the like, and the oxygen-containing precursor includes $O_2$, $O_3$, $H_2O$ or the like. In some embodiments, the $HfO_x$ layer is deposited by atomic layer deposition (ALD).

At act 12, a first purge process is performed to remove unreacted precursors and byproducts from the chamber. In some embodiments, the purge gas includes inert gas such as nitrogen.

At act 14, a first low-temperature annealing process of about 350° C. or less is performed to the $HfO_x$ layer. In some embodiments, the first low-temperature annealing process is an argon plasma performed at a temperature of about 100° C. to 350° C. (such as 150° C. to 300° C. or 200° C. to 250° C.) for about 1 second to 60 seconds (such as 10 seconds to 30 seconds). The first low-temperature annealing process is called a "first atomic layer annealing (ALA) process" in some examples. Other insert gas plasma such as nitrogen plasma may be applied to the first ALA process instead of argon plasma.

At act 16, a Zr-containing precursor and an oxygen-containing precursor are introduced to the chamber to deposit an $ZrO_x$ layer (wherein x is greater than 0) on the $HfO_x$ layer. In some embodiments, the Zr-containing precursor includes tetrakis(dimethylamino) zirconium (TD- MAZ) or the like, and the oxygen-containing precursor comprises $O_2$, $O_3$, $H_2O$ or the like. In some embodiments, the $ZrO_x$ layer is deposited by atomic layer deposition (ALD).

At act 18, a second purge process is performed to remove unreacted precursors and byproducts from the chamber. In some embodiments, the purge gas includes inert gas such as nitrogen.

At act 20, a second low-temperature annealing process of about 350° C. or less is performed to the $ZrO_x$ layer. In some embodiments, the second low-temperature annealing process is an argon plasma performed at a temperature of about 100° C. to 350° C. (such as 150° C. to 300° C. or 200° C. to 250° C.) for about 1 second to 60 seconds (such as 10 seconds to 30 seconds). The second low-temperature annealing process is called a "second atomic layer annealing (ALA) process" in some examples. Other insert gas plasma such as nitrogen plasma may be applied to the second ALA process instead of argon plasma.

In some embodiments, the process parameters of the first low-temperature annealing process (act 14) is the same as the process parameters of the second low-temperature annealing process (act 20), but the disclosure is not limited thereto. In other embodiments, the process parameters of the first low-temperature annealing process (act 14) may be different from the process parameters of the second low-temperature annealing process (act 20). For example, the temperature of the first low-temperature annealing process may be different from (e.g., greater than or less than) the temperature of the second low-temperature annealing process.

In above embodiments, both act 14 and act 20 are performed, but the disclosure is not limited thereto. In other embodiments, one of the act 14 and act 20 may be optional and may be omitted upon the process requirements. For example, act 20 of the second ALA process may be omitted to shorten the cycle time.

The method further includes repeating act 10 to act 20 multiple times, until the desired thickness of the $H_2O$ ferroelectric layer is deposited. The desired thickness of the ferroelectric layer is about 10 nanometers or less.

The Ru-based underlying layer play a significant role in inducing the desired ferroelectric crystalline phase and therefore the sufficient ferroelectric properties (such as remanent polarization (Pr) and leakage current) in the thin ferroelectric layer. The underlying Ru-based substrate in contact with the $H_2O$ ferroelectric layer provides an good interface for inducing the ferroelectric layer to form with the desired phase such as orthorhombic crystalline phase. For example, the deposited $H_2O$ ferroelectric layer has a thickness of 5-7 nm, the highest Pr value of 18-24 uC/cm$^2$ and a low leakage current of $10^{-2}$ to $10^{-4}$ A/cm$^2$. Specifically, the thin $H_2O$ ferroelectric layer deposited by the above method (i.e., repeating act 10 to act 20 multiple times) of the disclosure exhibits sufficient ferroelectric properties without the conventional high-temperature post-annealing process (about 400° C. or higher). More specifically, the conventional high-temperature post-annealing process is not required during the formation of the ferroelectric layer of the disclosure. Therefore, the manufacturing process is simplified and the production cost is reduced.

The ferroelectric structure or MFM scheme of the disclosure is provided without a post-annealing process to activate the ferroelectric properties in the ferroelectric layer. Such ferroelectric structure is referred to as a "post-anneal free MFM scheme" in some examples.

Figure 3:
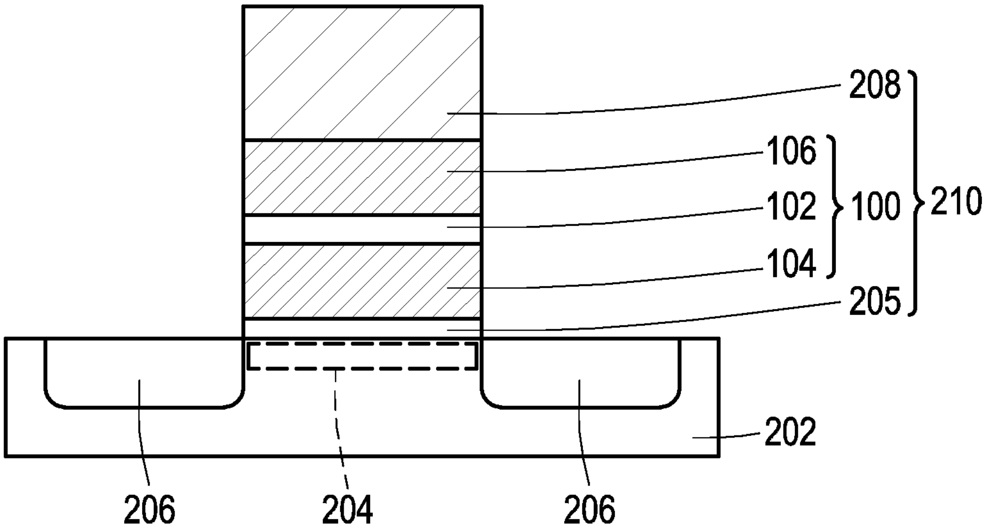
FIG. 3 to FIG. 4 illustrate cross-sectional views of a method of forming a semiconductor device according to some embodiments of the present disclosure.
Figure 4:
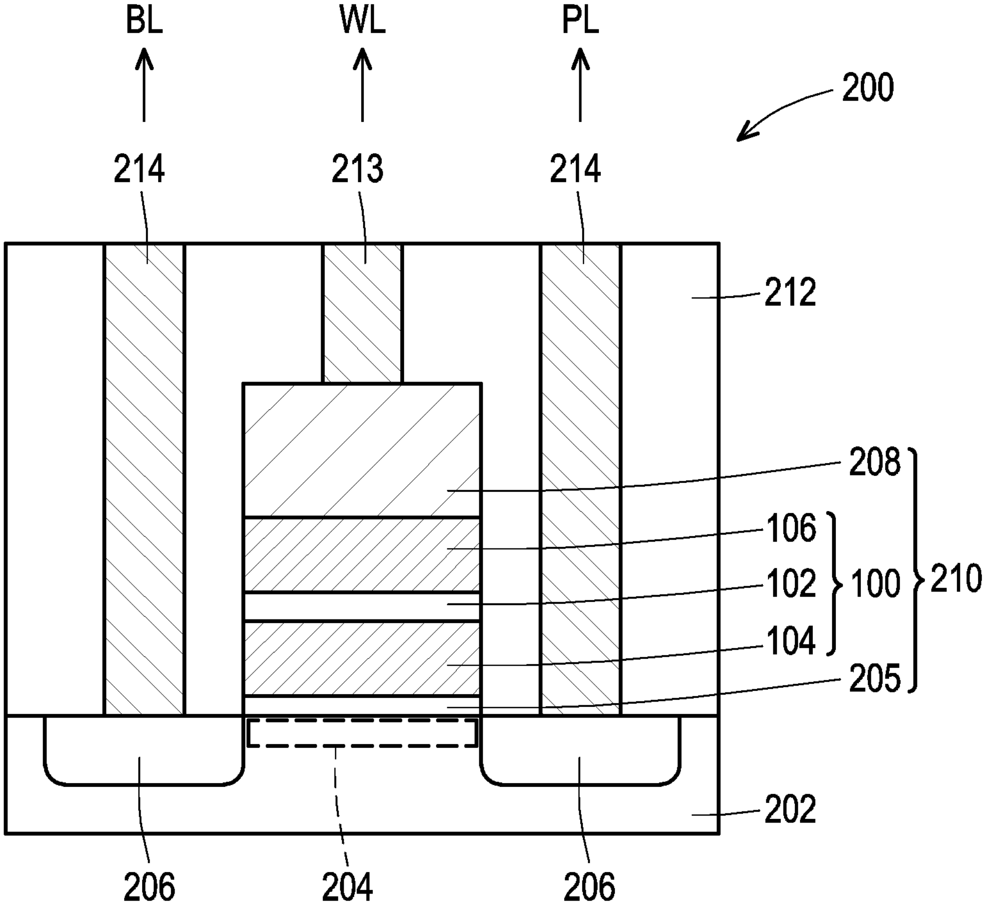

The ferroelectric structure or MFM scheme of the disclosure may be applied to a ferroelectric field-effect transistor (FeFET) device. FIG. 3 to FIG. 4 illustrate cross-sectional views of a method of forming a semiconductor device according to some embodiments of the present disclosure. Although FIG. 3 to FIG. 4 are described in relation to a method, it will be appreciated that the structures disclosed in FIG. 3 to FIG. 4 are not limited to such a method, but instead may stand alone as structures independent of the method.

Referring to FIG. 3, a gate stack 210 is formed on a substrate 202. In some embodiments, the substrate 202 includes one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 202 may be a semiconductor-on-insulator, including at least one layer of dielectric material (e.g., an oxide layer) disposed between a pair of semiconductor layers (e.g., silicon layers). The semiconductor substrate 202 may include various doped regions depending on circuit requirements (e.g., p-type semiconductor substrate or n-type semiconductor substrate).

In some embodiments, the gate stack 210 includes an interfacial layer 205 on the substrate 202. In some embodiments, the interfacial layer 205 includes an insulating material such as silicon oxide. In other embodiments, the interfacial layer 205 includes a high-k material having a dielectric constant greater than about 4, greater than about 12, greater than about 16, or even greater than about 20. For example, the high-k material may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In some embodiments, the interfacial layer 205 includes an insulating material and a high-k material, and the materials of the insulating material and the high-k material are similar to those described above. In some embodiments, the interfacial layer 205 may be optional and may be omitted as needed.

In some embodiments, the gate stack 210 further includes a ferroelectric structure 100 on the interfacial layer 205, and the ferroelectric structure 100 includes, from bottom to top, a first ferroelectric inducing layer 104, a ferroelectric layer 102, and a second ferroelectric inducing layer 106. The ferroelectric structure 100 of FIG. 3 is the same as the ferroelectric structure 100 of FIG. 1, so the details are not iterated herein. Each of the first ferroelectric inducing layer 104 and second ferroelectric inducing layer 106 includes Ru, the ferroelectric layer 102 includes HfZrO, and the Ru of each of the first ferroelectric inducing layer 104 and second ferroelectric inducing layer 106 is in physical contact with the the HfZrO of the ferroelectric layer 102.

The method of forming the ferroelectric layer 102 include performing a suitable deposition process such as atomic layer deposition (ALD), and the forming method is described in FIG. 2, so the details are not limited herein. The ferroelectric layer 102 is formed at a low-temperature process (less than 350° C.) without a high-temperature post-annealing process (more than 400° C.). The ferroelectric layer 102 has a thickness of about 1 to 10 nm and a remanent polarization (Pr) of about 10 $uC/cm^2$ or more, such as about 10-30 $uC/cm^2$ or 15-25 $uC/cm^2$. In some embodiments, the Ru atom content of at least one of the first ferroelectric inducing layer 104 and second ferroelectric inducing layer 106 is gradually increased towards the ferroelectric layer 102 from 50 at % to 100 at %.

In some embodiments, the gate stack 210 further includes a cap layer 208 on the ferroelectric structure 100. In some embodiments, the cap layer 208 may be a metal cap and may include metal such as Ti, TiN, Ta, TaN, W, Pt, Al, Cu, the like, or a combination thereof. In some embodiments, the cap layer 208 may be a dielectric cap and may include silicon nitride, silicon carbide, metal oxide such as $Al_2O_3$, the like, or a combination thereof. In some embodiments, the cap layer 208 may be optional and may be omitted as needed.

The method of forming the gate stack 210 includes forming multiple blanket films (not shown) on the substrate, and patterning the blanket films through photolithography and etching processes. In some embodiments, the interfacial layer 205 and the cap layer 208 may be regarded as part of the ferroelectric structure of the disclosure.

Thereafter, the epitaxial regions 206 are formed in the substrate 202 and a channel 204 is provided between the epitaxial regions 206. The epitaxial regions 406 serve as source/drain regions of the semiconductor device. In some embodiments, the epitaxial regions 206 may doped with p-type or n-type dopants and may have a single-layered structure or a multi-layered structure, with different layers having different degrees of doping. In some embodiments, the method of forming the epitaxial regions 206 includes performing an ion implantation process by using spacers (not shown) on sidewalls of the gate stack 210 as an implantation mask.

Referring to FIG. 4, a dielectric layer 212 is formed over the substrate 100, covering the gate stack 210. In some embodiments, the dielectric layer 212 includes silicon oxide. In some embodiments, the dielectric layer 212 includes a low-k material having a dielectric constant less than about 4, less than about 3.5, less than about 3, or even greater than about 2.5. For example, the low-k material may include SiOC, Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof.

Afterwards, contacts 213 and 214 are formed through the dielectric layer 212. The contacts 213 and 214 may include metal such as Ti, TiN, Ta, TaN, W, Pt, Al, Cu, the like, or a combination thereof. In the case that the cap layer 208 is a metal cap, the contact 213 penetrates through the dielectric layer 212 and is landed on the cap layer 208. In the case that the cap layer 208 is omitted from the gate stack 210, the contact 213 penetrates through the dielectric layer 212 and is landed on the second ferroelectric inducing layer 106. In the case that the cap layer 208 is a dielectric cap, the contact 213 penetrates through the dielectric layer 212 and the cap layer 208 and is landed on the second ferroelectric inducing layer 106. The contacts 214 penetrate through the dielectric layer 212 and are landed on the epitaxial layers 206. In some embodiments, the contact 213 is electrically connected to a word line WL, one of the contacts 214 is electrically connected to a bit line BL, and another of the contacts 214 is electrically connected to a plate line PL. The semiconductor structure 200 is thus completed.

Figure 5:
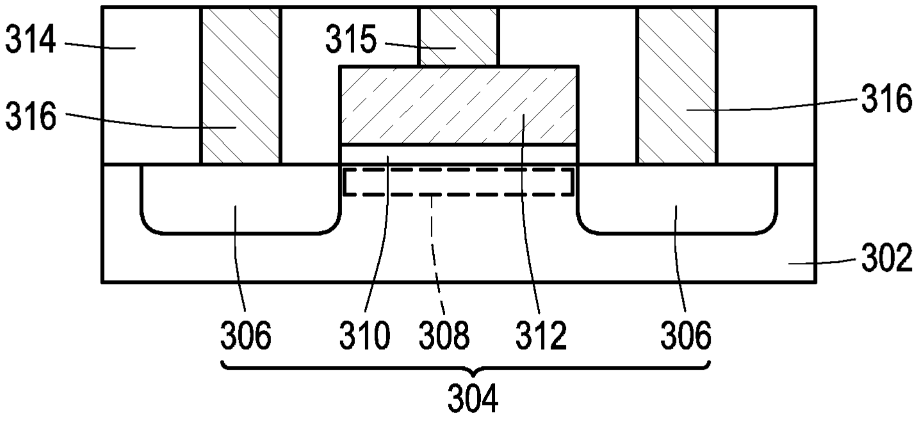
FIG. 5 to FIG. 7 illustrate cross-sectional views of a method of forming a semiconductor device according to some embodiments of the present disclosure.
Figure 6:
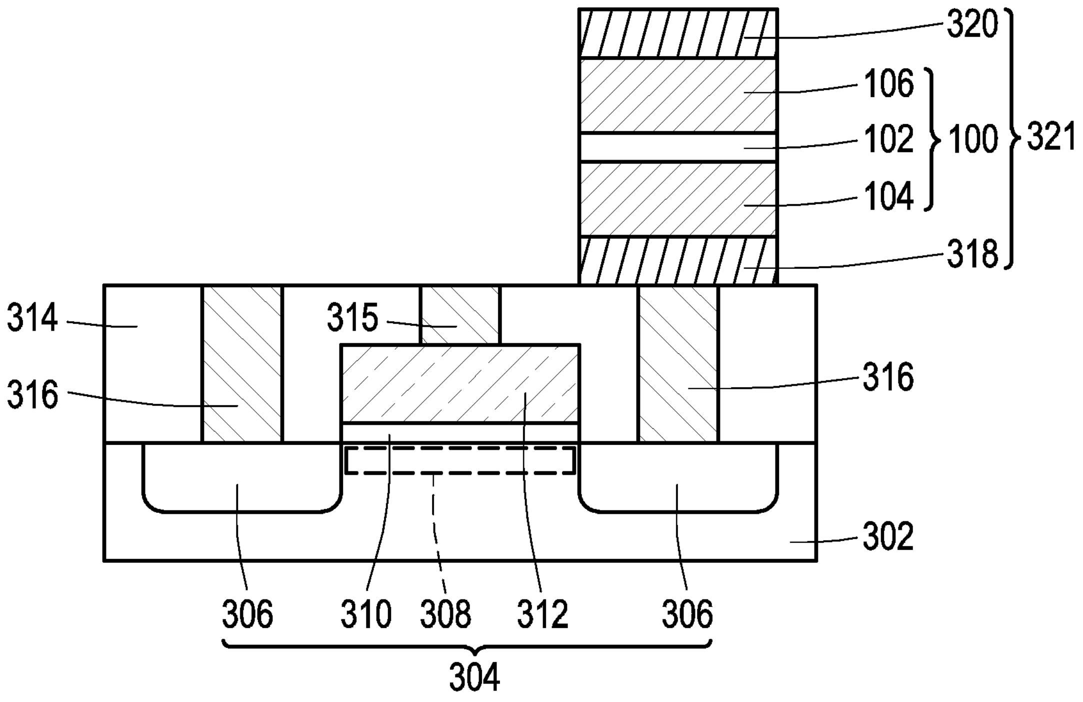
Figure 7:
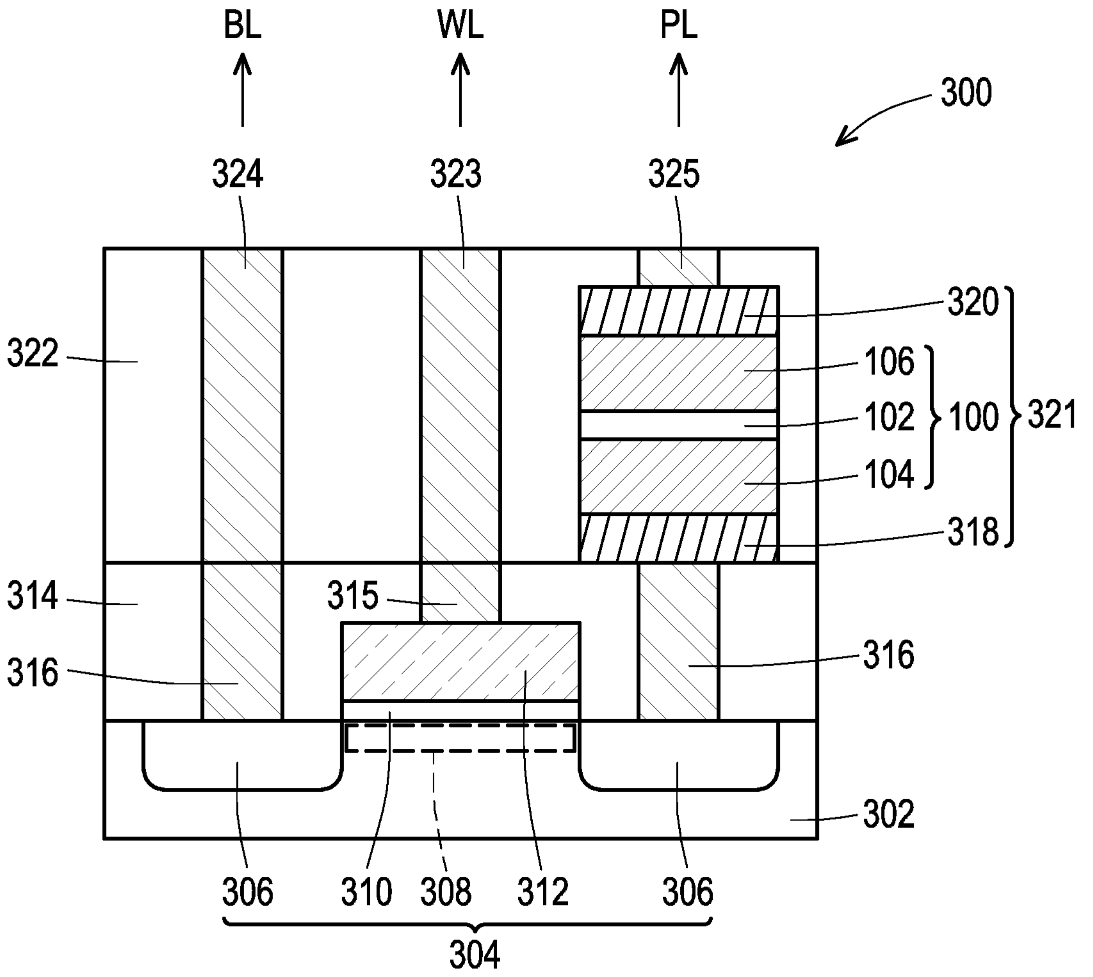

The ferroelectric structure or MFM scheme of the disclosure may be applied to a ferroelectric random-access memory (FeRAM) device. FIG. 5 to FIG. 7 illustrate cross-sectional views of a method of forming a semiconductor device according to some embodiments of the present disclosure. Although FIG. 5 to FIG. 7 are described in relation to a method, it will be appreciated that the structures disclosed in FIG. 5 to FIG. 7 are not limited to such a method, but instead may stand alone as structures independent of the method.

Referring to FIG. 5, a transistor 304 is formed along a substrate 302. The substrate 302 includes one or more semiconductor materials, which may be elemental semiconductor materials, compound semiconductor materials, or semiconductor alloys, and the materials of the substrate 302 are similar to those descried in the substrate 202. In some embodiments, a gate dielectric material (not shown) and a gate electrode material (not shown) are blanket-deposited over the substrate 302 and are subsequently patterned to form a gate dielectric layer 310 and a gate electrode 312. The gate dielectric layer 310 may include an insulating material such as silicon oxide or a high-k material such as metal oxide, and the materials of the gate dielectric layer 310 are similar to those descried in the interfacial layer 205. The gate electrode 312 may include doped polysilicon or a metal gate. Epitaxial regions 306 are formed in the substrate 302 at opposite sides of the gate electrode 312 by doping the substrate 302 (e.g., by way of an ion implantation process or some other suitable process), and a channel 308 is provided between the epitaxial regions 306.

Thereafter, a dielectric layer 314 is deposited over the substrate 302. The dielectric layer 314 may include silicon oxide or a low-k material, and the materials of the dielectric layer 314 are similar to those descried in the dielectric layer 212.

Afterwards, contacts 315 and 316 are formed through the dielectric layer 314 and electrically connected to the transistor 304. The dielectric layer 314 is patterned to form contact openings (not shown) in the dielectric layer 314. A conductor is deposited over the substrate 302 to form contacts 315 and 316 in the contact openings. The contacts 315 and 316 may include metal such as Ti, TiN, Ta, TaN, W, Pt, Al, Cu, the like, or a combination thereof. In some embodiments, the contact 315 is landed on the gate electrode 312, and the contacts 316 are landed on the epitaxial regions 306.

Referring to FIG. 6, a ferroelectric stack 321 is formed on the dielectric layer 314 and electrically connected to one of the contacts 316. In some embodiments, the ferroelectric stack 321 includes a conductive layer 318. The conductive layer 318 may include metal such as Ti, TiN, Ta, TaN, W, Pt, Al, Cu, the like, or a combination thereof. The conductive layer 318 may be a Ru-free metal layer. In some embodiments, the conductive layer 318 may be optional and may be omitted as needed.

In some embodiments, the ferroelectric stack 321 further includes a ferroelectric structure 100 on the conductive layer 318, and the ferroelectric structure 100 includes, from bottom to top, a first ferroelectric inducing layer 104, a ferroelectric layer 102, and a second ferroelectric inducing layer 106. The ferroelectric structure 100 of FIG. 6 is the same as the ferroelectric structure 100 of FIG. 1, so the details are not iterated herein. Each of the first ferroelectric inducing layer 104 and second ferroelectric inducing layer 106 includes Ru, the ferroelectric layer 102 includes HfZrO, and the Ru of each of the first ferroelectric inducing layer 104 and second ferroelectric inducing layer 106 is in physical contact with the the HfZrO of the ferroelectric layer 102.

The method of forming the ferroelectric layer 102 include performing a suitable deposition process such as atomic layer deposition (ALD), and the forming method is described in FIG. 2, so the details are not limited herein. The ferroelectric layer 102 is formed at a low-temperature process (less than 350° C.) without a high-temperature post-annealing process (more than 400° C.). The ferroelectric layer 102 has a thickness of about 1 to 10 nm and a remanent polarization (Pr) of about 10 uC/cm$^2$ or more, such as about 10-30 uC/cm$^2$ or 15-25 uC/cm$^2$. In some embodiments, the Ru atom content of at least one of the first ferroelectric inducing layer 104 and second ferroelectric inducing layer 106 is gradually increased towards the ferroelectric layer 102 from 50 at % to 100 at %.

In some embodiments, the ferroelectric stack 321 further includes a conductive layer 320. The conductive layer 320 may include metal such as Ti, TiN, Ta, TaN, W, Pt, Al, Cu, the like, or a combination thereof. The conductive layer 320 may be a Ru-free metal layer. In some embodiments, the conductive layer 320 may be optional and may be omitted as needed.

The method of forming the ferroelectric stack 321 includes forming multiple blanket films (not shown) on the substrate, and patterning the blanket films through photolithography and etching processes.

Referring to FIG. 7, a dielectric layer 322 is formed over the substrate 100, covering the dielectric layer 314 and the ferroelectric stack 321. The dielectric layer 322 may include silicon oxide or a low-k material, and the materials of the dielectric layer 314 are similar to those descried in the dielectric layer 212. The dielectric layer 322 is patterned to form via openings (not shown) in the dielectric layer 322. A conductor is deposited over the substrate 302 to form vias 323, 324 and 325 in the via openings. The vias 323, 324 and 325 may include metal such as Ti, TiN, Ta, TaN, W, Pt, Al, Cu, the like, or a combination thereof. In some embodiments, the via 323 is electrically connected to and landed on the contact 315, the via 324 is electrically connected to and landed on the underlying contact 316, and the via 325 is electrically connected to and landed on the conductive layer 320. In some embodiments, the via 323 is electrically connected to a word line WL, the via 324 is electrically connected to a bit line BL, and the via 325 is electrically connected to a plate line PL. The semiconductor structure 300 is thus completed. In the semiconductor structure 300, the conductive layer 318 (e.g., Ru-free layer, such as TiN) and the first ferroelectric inducing layer 104 (e.g., Ru-based layer) serve as a bottom electrode, and the conductive layer 320 (e.g., Ru-free layer, such as TiN) and the second ferroelectric inducing layer 106 (e.g., Ru-based layer) serve as a top electrode.

Figure 8:
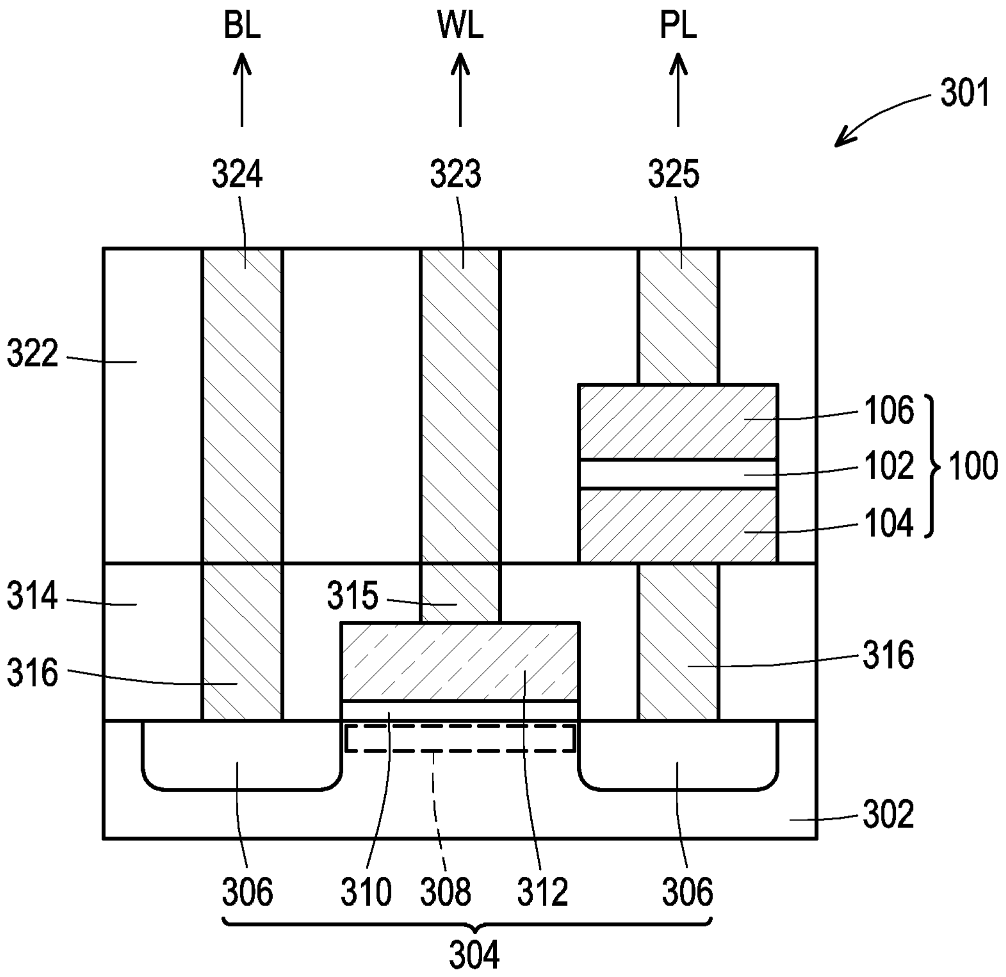
FIG. 8 to FIG. 10 illustrate cross-sectional views of various semiconductor devices according to other embodiments of the present disclosure.
Figure 9:
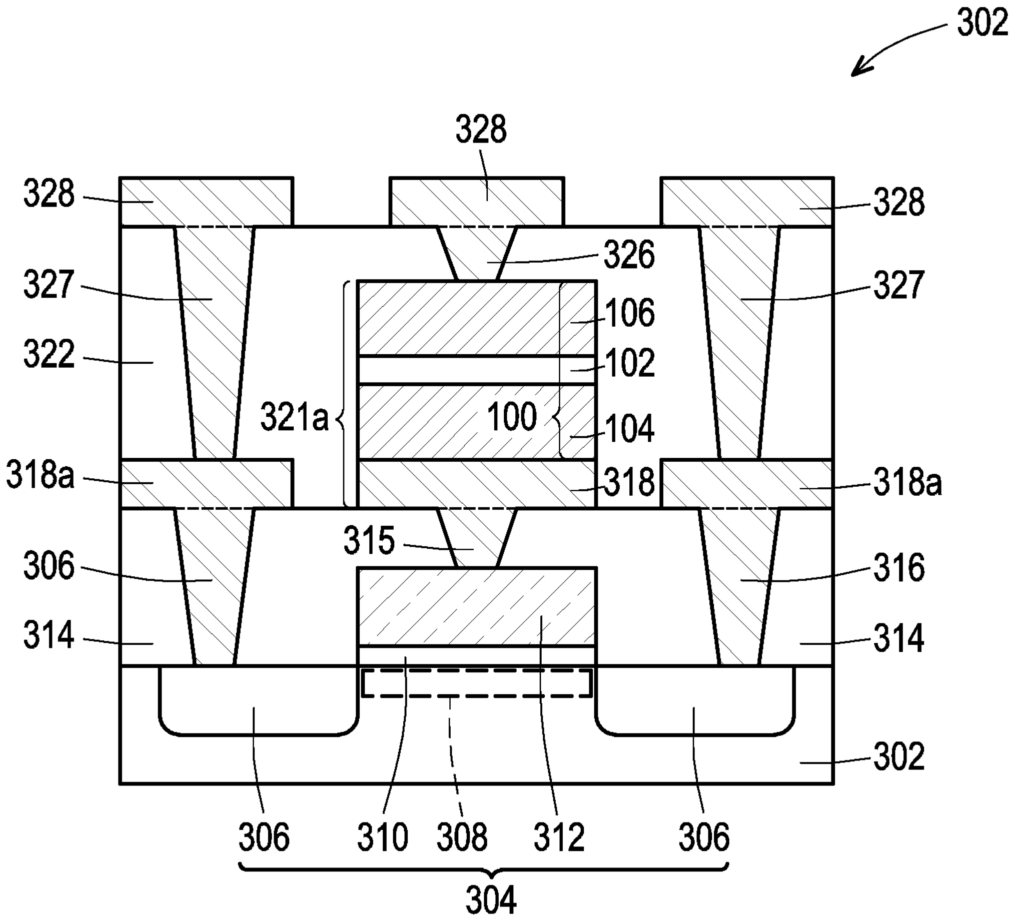
Figure 10:
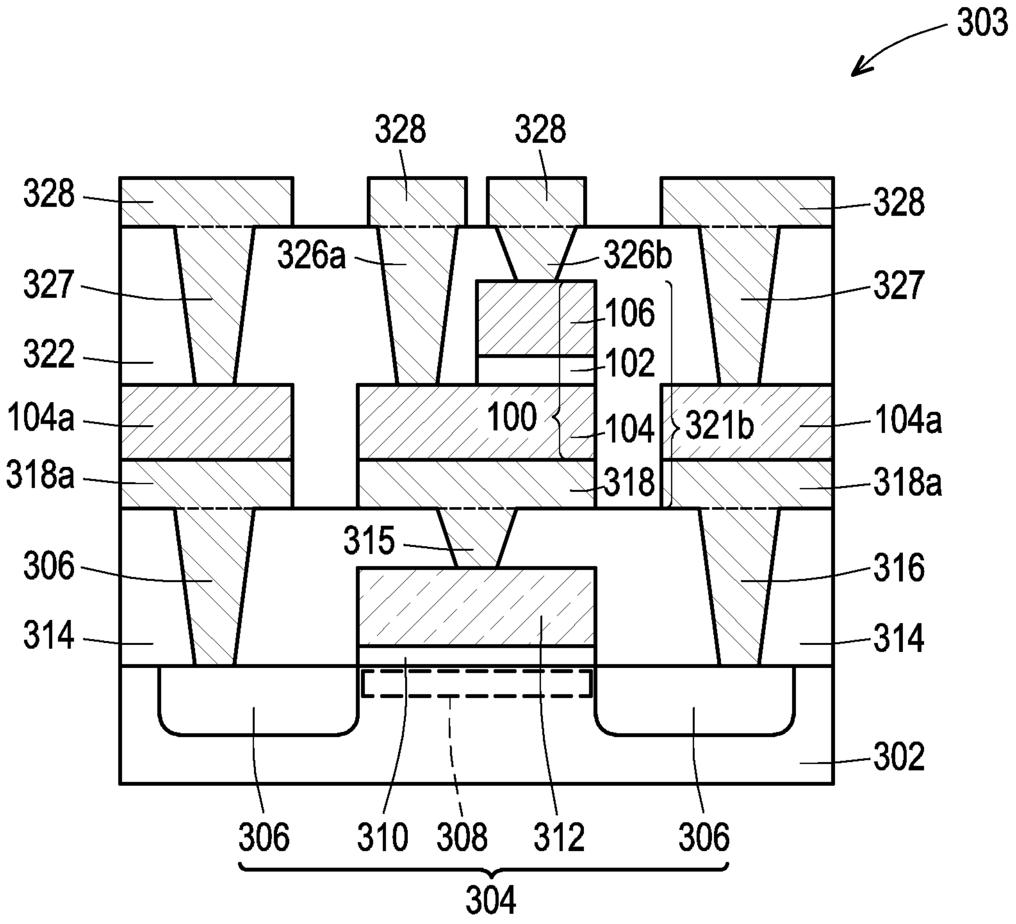

FIG. 8 to FIG. 10 illustrate cross-sectional views of various semiconductor devices according to other embodiments of the present disclosure. Each of the semiconductor devices 301 to 303 are similar to the semiconductor device 300, so the difference between them is described below, and the similarity is not iterated herein.

In some embodiments, one or both of the conductive layer 318 and the conductive layer 320 of the ferroelectric stack 321 may be optionally omitted as needed. For example, both of the the conductive layer 318 and the conductive layer 320 are omitted from the semiconductor device 300, so as to form a semiconductor device 301 in FIG. 8. In the semiconductor device 301, the first ferroelectric inducing layer 104 (e.g., Ru-based layer) serves as a bottom electrode, and the second ferroelectric inducing layer 106 (e.g., Ru-based layer) serves as a top electrode.

Besides, the location of the ferroelectric stack 321 may be shifted to other suitable locations as needed. For example, in the semiconductor device 300, the ferroelectric stack 321 is located above and corresponds to the one of the epitaxial layers 306. However, in the semiconductor device 302 of FIG. 9, the ferroelectric stack 321*a* is located above and corresponds to the gate electrode 312. Specifically, the ferroelectric stack 321*a* includes, from bottom to top, a first conductive layer 318 and a ferroelectric structure 100 over the first conductive layer 318. In the semiconductor device 302 of FIG. 9, a part of conductive layer 318 is connected to the contact 315, and parts of the conductive layer 318 (labelled as conductive layer 318*a*) are connected to the contacts 316. The conductive layer 318*a* and the underlying contact 306 may be formed as an integral line-and-contact structure without a visible interface therebetween.

The semiconductor device 302 further includes vias 326 and 327 penetrating through the dielectric layer 322. The vias 326 and 327 may include metal such as Ti, TiN, Ta, TaN, W, Pt, Al, Cu, the like, or a combination thereof. In some embodiments, the via 326 is electrically connected to and landed on the second ferroelectric inducing layer 106, and the vias 327 are electrically connected to and landed on the underlying conductive layer 318*a*. The semiconductor device 302 may further include a conductive layer 328 disposed over the dielectric layer 322 and electrically connected to the vias 326 and 327. The conductive layer 328 and the underlying via 326/327 may be formed as an integral line-and-via structure without a visible interface therebetween. In some embodiments, in the semiconductor device 302 of FIG. 9, the conductive layer 318 of the ferroelectric stack 321*a* may be optionally omitted as needed.

In the above embodiments, the sidewall of the first ferroelectric inducing layer 104 is flushed with the sidewalls of the overlying ferroelectric layer 102 and the second ferroelectric inducing layer 106. However, the disclosure is not limited thereto. In other embodiments, the sidewall of the first ferroelectric inducing layer 104 may be not flushed with the sidewalls of the overlying ferroelectric layer 102 and the second ferroelectric inducing layer 106.

The ferroelectric stack 321*a* of FIG. 9 is similar to the ferroelectric stack 321*b* of FIG. 10, so the difference between them is described below, and the similarity is not iterated herein. Specifically, first sidewall of the first ferroelectric inducing layer 104 is flushed with first sidewalls of the overlying ferroelectric layer 102 and the second ferroelectric inducing layer 106, while second sidewall of the first ferroelectric inducing layer 104 is protruded from second sidewalls of the overlying ferroelectric layer 102 and the second ferroelectric inducing layer 106. In the ferroelectric stack 321*b* of FIG. 10, the sidewalls of first ferroelectric inducing layer 104 are flushed with the sidewalls of the underlying conductive layer 318.

The method of forming the ferroelectric stack 321*b* includes forming multiple blanket films (not shown) on the substrate, and performing a first patterning process (e.g., photolithography and etching processes) to pattern the blanket films into multiple film stacks with substantially vertical sidewalls. Therefore, a second patterning process (e.g., photolithography and etching processes) is performed to the film stacks by using the first ferroelectric material as an etching mask, so as to form the ferroelectric stack 321*b* over the contact 315 and remain parts of the first ferroelectric layer 104 (labelled as first ferroelectric layer 104*a*) on the underlying conductive layer 318*a*.

The semiconductor device 303 further includes vias 326*a*, 326*b* and 327 penetrating through the dielectric layer 322. The vias 326*a*, 326*b* and 327 may include metal such as Ti, TiN, Ta, TaN, W, Pt, Al, Cu, the like, or a combination thereof. In some embodiments, the via 326*a* is electrically connected to and landed on the first ferroelectric inducing layer 104, the via 326*b* is electrically connected to and landed on the second ferroelectric inducing layer 106, and the vias 327 are electrically connected to and landed on the underlying conductive layer 318*a*. The semiconductor device 303 may further include a conductive layer 328 disposed over the dielectric layer 322 and electrically connected to the vias 326*a*, 326*b* and 327. The conductive layer 328 and the underlying via 326*a*/326*b*/327 may be formed as an integral line-and-via structure without a visible interface therebetween. In some embodiments, in the semiconductor device 303 of FIG. 10, the conductive layer 318 of the ferroelectric stack 321*b* may be optionally omitted as needed.

Figure 11:
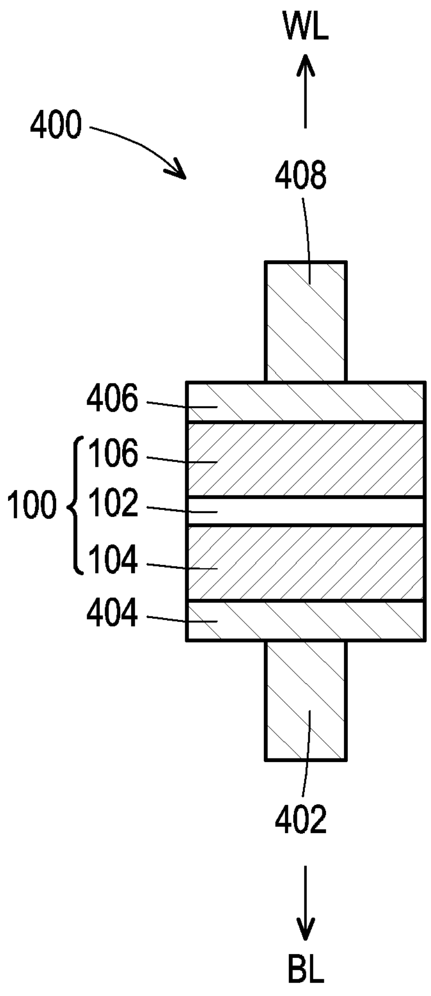
FIG. 11 illustrates a cross-sectional view of a semiconductor device according to some embodiments of the present disclosure.

The ferroelectric structure or MFM scheme of the disclosure may be applied to a ferroelectric tunnel junction (FTJ) device. FIG. 11 illustrates a cross-sectional view of a semiconductor device according to some embodiments of the present disclosure.

In the semiconductor device 400 of FIG. 11, a ferroelectric structure 100 is sandwiched by conductive layers 404 and 406. The ferroelectric structure 100 of FIG. 11 is the same as the ferroelectric structure 100 of FIG. 1, so the details are not iterated herein. Each of the first ferroelectric inducing layer 104 and second ferroelectric inducing layer 106 includes Ru, the ferroelectric layer 102 includes HfZrO, and the Ru of each of the first ferroelectric inducing layer 104 and second ferroelectric inducing layer 106 is in physical contact with the the HfZrO of the ferroelectric layer 102.

The method of forming the ferroelectric layer 102 include performing a suitable deposition process such as atomic layer deposition (ALD), and the forming method is described in FIG. 2, so the details are not limited herein. The ferroelectric layer 102 is formed at a low-temperature process (less than 350° C.) without a high-temperature post-annealing process (more than 400° C.). The ferroelectric layer 102 has a thickness of about 1 to 10 nm and a remanent polarization (Pr) of about 10 $uC/cm^2$ or more, such as about 10-30 $uC/cm^2$ or 15-25 $uC/cm^2$. In some embodiments, the Ru atom content of at least one of the first ferroelectric inducing layer 104 and second ferroelectric inducing layer 106 is gradually increased towards the ferroelectric layer 102 from about 50 at % to about 100 at %.

In the semiconductor device 400 of FIG. 11, the first ferroelectric inducing layer 104 is electrically connected to a bit line BL through the conductive layer 404 and the underlying via 402, and the second ferroelectric inducing layer 104 is electrically connected to a word line WL through the conductive layer 406 and the overlying via 408. Each of the conductive layers 404, 406 and vias 402, 408 may include metal such as Ti, TiN, Ta, TaN, W, Pt, Al, Cu, the like, or a combination thereof. Each of the conductive layers 404, 406 and vias 402, 408 may be a Ru-free metal layer. In some embodiments, each of the conductive layers 404, 406 and vias 402, 408 may be optional and may be omitted as needed.

In view of the above, the present disclosure is directed to ferroelectric structure that include a thin ferroelectric layer including HfZrO sandwiched by two Ru-based layers. The Ru-based layers play a significant role in inducing the ferroelectric crystalline phase and therefore the ferroelectric properties (such as remanent polarization (Pr) and leakage current) in the thin ferroelectric layer. The Ru-based layers in contact with the HfZrO ferroelectric layer provide good interfaces to induce the ferroelectric layer to form with the desired phase such as orthorhombic crystalline phase. Specifically, the thin ferroelectric layer deposited by the method of the disclosure exhibits sufficient ferroelectric properties without the conventional post-annealing process. Therefore, the manufacturing process is simplified and the production cost is reduced.

In some embodiments, the present disclosure relates to a method of forming a semiconductor device. A first ferroelectric inducing layer including Ru is deposited on a substrate. A ferroelectric layer including HfZrO is deposited on the first ferroelectric inducing layer. A second ferroelectric inducing layer including Ru is deposited on the ferroelectric layer, wherein the HfZrO of the ferroelectric layer is in physical contact with the Ru of the first ferroelectric inducing layer and the Ru of the second ferroelectric inducing layer. The second ferroelectric inducing layer, the ferroelectric layer and the first ferroelectric inducing layer are patterned.

In other embodiments, the present disclosure relates to a method of forming a semiconductor device. A transistor is provide, and the transistor includes a gate stack on a substrate and epitaxial layers in the substrate at two sides of the gate stack. A ferroelectric stack is formed over and electrically connected to the transistor. The method of forming the ferroelectric stack comprises: forming a first electrode; forming a ferroelectric layer comprising HfZrO on the first electrode; and forming a second electrode on the ferroelectric layer. The ferroelectric layer is formed at a low temperature process of about 350° C. or less and has a remanent polarization (Pr) of about 10 $uC/cm^2$ or more, such as about 10-30 $uC/cm^2$ or 15-25 $uC/cm^2$.

In other embodiments, the present disclosure relates to a semiconductor device. The semiconductor device includes a first electrode, a second electrode, and a HfZrO-containing ferroelectric layer disposed between the first electrode and the second electrode. Each of the first electrode and the second electrode comprises a Ru-based layer, and the Ru-based layer is in contact with the HfZrO of the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
- providing a transistor, wherein the transistor comprises a gate stack on a substrate and epitaxial layers in the substrate at two sides of the gate stack; and
- forming a ferroelectric stack over and electrically connected to the transistor, wherein a method of forming the ferroelectric stack comprises:
  - forming a first electrode;
  - forming a ferroelectric layer comprising HfZrO on the first electrode, wherein the ferroelectric layer is formed at a low temperature process of about 350° C. or less and has a remanent polarization (Pr) of about 10 $uC/cm^2$ or more; and forming a second electrode on the ferroelectric layer, wherein each of the first electrode and the second electrode comprises a Ru-based layer, and a thickness of the Ru-based layer is about 2 to 5 times a thickness of the ferroelectric layer.

2. The method of claim 1, wherein the ferroelectric layer has a thickness of about 1 to 10 nm.

3. The method of claim 1, wherein a post-annealing process of greater than 350° C. is absent after depositing the ferroelectric layer and before forming the second electrode.

4. The method of claim 1, wherein the first electrode comprises Ru, the second electrode comprises Ru, and the HfZrO of the ferroelectric layer is in physical contact with the Ru of the first electrode and the Ru of the second electrode.

5. The method of claim 1, wherein each of the first electrode and the second electrode has a multiple-layer structure comprising the Ru-based layer and a Ru-free layer, and the Ru-based layer is in contact with the ferroelectric layer.

6. The method of claim 1, wherein a sidewall of the first electrode layer is protruded from a sidewall of the ferroelectric layer.

7. A method of forming a semiconductor device, comprising:

providing a transistor, wherein the transistor comprises a gate stack on a substrate and epitaxial layers in the substrate at two sides of the gate stack; and forming a ferroelectric stack over and electrically connected to the transistor, wherein a method of forming the ferroelectric stack comprises:

forming a first electrode;

forming a ferroelectric layer comprising HfZrO on the first electrode, wherein the ferroelectric layer is formed at a low temperature process of about 350° C. or less and has a remanent polarization (Pr) of about 10 $uC/cm^2$ or more; and forming a second electrode on the ferroelectric layer, wherein each of the first electrode and the second electrode comprises a Ru-alloy layer.

8. The method of claim 7, wherein a Ru atom content of the first electrode or the second electrode is gradually increased towards the ferroelectric layer.

9. The method of claim 7, wherein a method of forming the ferroelectric layer comprises:

introducing a Hf-containing precursor and an oxygen-containing precursor to a chamber to deposit a $HfO_x$ layer on the first electrode;

introducing a Zr-containing precursor and an oxygen-containing precursor to the chamber to deposit an $ZrO_x$ layer on the $HfO_x$ layer; and repeating above steps multiple times until a desired thickness of the ferroelectric layer is deposited, wherein the low temperature process of about 350° C. or less includes a first low-temperature annealing process of about 350° C. or less, the first low-temperature annealing process of about 350° C. or less is performed after depositing the $HfO_x$ layer and before depositing the $ZrO_x$ layer.

10. The method of claim 9, wherein the Hf-containing precursor comprises tetrakis(dimethylamino) hafnium (TDMAH), the Zr-containing precursor comprises tetrakis(dimethylamino) zirconium (TDMAZ), and the oxygen-containing precursor comprises $O_2$, $O_3$ or $H_2O$.

11. The method of claim 9, wherein the first low-temperature annealing process is an argon plasma performed at a temperature of about 100° C. to 350° C. for 1 second to 60 seconds.

12. The method of claim 9, wherein the low temperature process of about 350° C. or less includes a second low-temperature annealing process of about 350° C. or less, the second low-temperature annealing process of about 350° C. or less is performed after depositing the $ZrO_x$ layer and before the repeating step.

13. The method of claim 12, wherein the second low-temperature annealing process is an argon plasma performed at a temperature of 100° C. to 350° C. for 1 second to 60 seconds.

14. The method of claim 7, wherein the ferroelectric layer has a thickness of about 1 to 10 nm.

15. The method of claim 7, wherein each of the first electrode and the second electrode has a multiple-layer structure comprising a Ru-based layer and a Ru-free layer, the Ru-based layer comprises the Ru-alloy layer, and the Ru-based layer is in contact with the ferroelectric layer.

16. The method of claim 15, wherein the Ru-based layer further comprises a Ru layer on the Ru-alloy layer, and the Ru layer is in contact with the ferroelectric layer.

17. A method of forming a semiconductor device, comprising:

providing a transistor, wherein the transistor comprises a gate stack and doped regions at two sides of the gate stack; and forming a ferroelectric stack over and electrically connected to the transistor, wherein a method of forming the ferroelectric stack comprises:

forming a bottom electrode;

forming a ferroelectric layer comprising HfZrO on the bottom electrode, wherein the ferroelectric layer is formed at a low temperature process of about 350° C. or less and has a remanent polarization (Pr) of about 10 $uC/cm^2$ or more; and forming a top electrode on the ferroelectric layer, wherein each of the bottom electrode and the top electrode comprises a Ru-alloy layer.

18. The method of claim 1, wherein each of the bottom electrode and the top electrode has a multiple-layer structure comprising a Ru-based layer and a Ru-free layer, the Ru-based layer comprises the Ru-alloy layer, and the Ru-based layer is in contact with the ferroelectric layer.

19. The method of claim 18, wherein a thickness of the Ru-based layer is about 2 to 5 times a thickness of the ferroelectric layer.

20. The method of claim 19, wherein the thickness of the ferroelectric layer ranges from about 1 to 10 nm.

* * * * *